(12) United States Patent
Morrow et al.

(10) Patent No.: US 7,217,595 B2
(45) Date of Patent: May 15, 2007

(54) SEALED THREE DIMENSIONAL METAL BONDED INTEGRATED CIRCUITS

(75) Inventors: Patrick Morrow, Portland, OR (US); Grant Kloster, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 100 days.

(21) Appl. No.: 10/791,492

(22) Filed: Mar. 1, 2004

(65) Prior Publication Data

US 2005/0189632 A1 Sep. 1, 2005

(51) Int. Cl.
*H01L 21/00* (2006.01)
*H01L 23/02* (2006.01)

(52) U.S. Cl. .................. 438/108; 438/109; 438/118; 438/E21.503; 438/E21.705; 257/686; 257/777; 257/E21.503; 257/E21.705; 257/E25.013

(58) Field of Classification Search ............. 438/108, 438/118, 109; 257/686, 777, E21.503, E21.705, 257/E23.015
See application file for complete search history.

(56) References Cited

U.S. PATENT DOCUMENTS

| 5,399,898 | A | * | 3/1995 | Rostoker | 257/499 |
| 5,863,970 | A | * | 1/1999 | Ghoshal et al. | 523/434 |
| 6,339,254 | B1 | * | 1/2002 | Venkateshwaran et al. | 257/686 |
| 6,566,745 | B1 | * | 5/2003 | Beyne et al. | 257/680 |
| 6,613,606 | B1 | * | 9/2003 | Lee | 438/108 |
| 6,777,268 | B2 | * | 8/2004 | Jiang | 438/118 |
| 6,820,329 | B2 | * | 11/2004 | Fang | 29/840 |
| 2002/0158318 | A1 | * | 10/2002 | Chen | 257/678 |

* cited by examiner

*Primary Examiner*—Michael Lebentritt
*Assistant Examiner*—Ron Pompey
(74) *Attorney, Agent, or Firm*—Michael D. Plimier; Kathy J. Ortiz

(57) ABSTRACT

The invention provides a sealing layer that seals metal bonding structures between three dimensional bonded integrated circuits from a surrounding environment. A material may be applied to fill a volume between the bonded integrated circuits or seal the perimeter of the volume between the bonded integrated circuits. The material may be the same material as that used for underfilling the volume between the bottom integrated circuit and a substrate.

12 Claims, 9 Drawing Sheets

SEALED THREE DIMENSIONAL METAL BONDED INTEGRATED CIRCUITS

BACKGROUND

Background of the Invention

In three dimensional integrated circuits, there are microelectronic devices on more than one device layer. This allows three dimensional integrated circuits to have a higher device density and a smaller chip area than non-three dimensional integrated circuits.

To form a three dimensional integrated circuit, several semiconductor dies with microelectronic devices are fabricated at once on a first wafer. Several more semiconductor dies with microelectronic devices are fabricated at once on a second wafer. Conductors from dies on the first wafer are bonded to conductors from the dies on the second wafer to form the three dimensional bonded integrated circuits. The wafers are cut apart to result in a three dimensional bonded integrated circuits where a die from the first wafer is bonded to a die from the second wafer.

Alternatively, the wafers may be cut into dies prior to being bonded together. The first and second wafers may each be cut into dies. A die from the first wafer may then be bonded to a die from the second wafer to form a three dimensional bonded integrated circuit.

The resulting three dimensional metal bonded integrated circuits have conductors, usually copper, extending between the two integrated circuits. These conductors can have exposed surfaces between the two integrated circuits. These exposed surfaces may be affected by environmental factors. For example, the copper conductors may corrode and cause the device to fail.

DETAILED DESCRIPTION

Figure 1A:
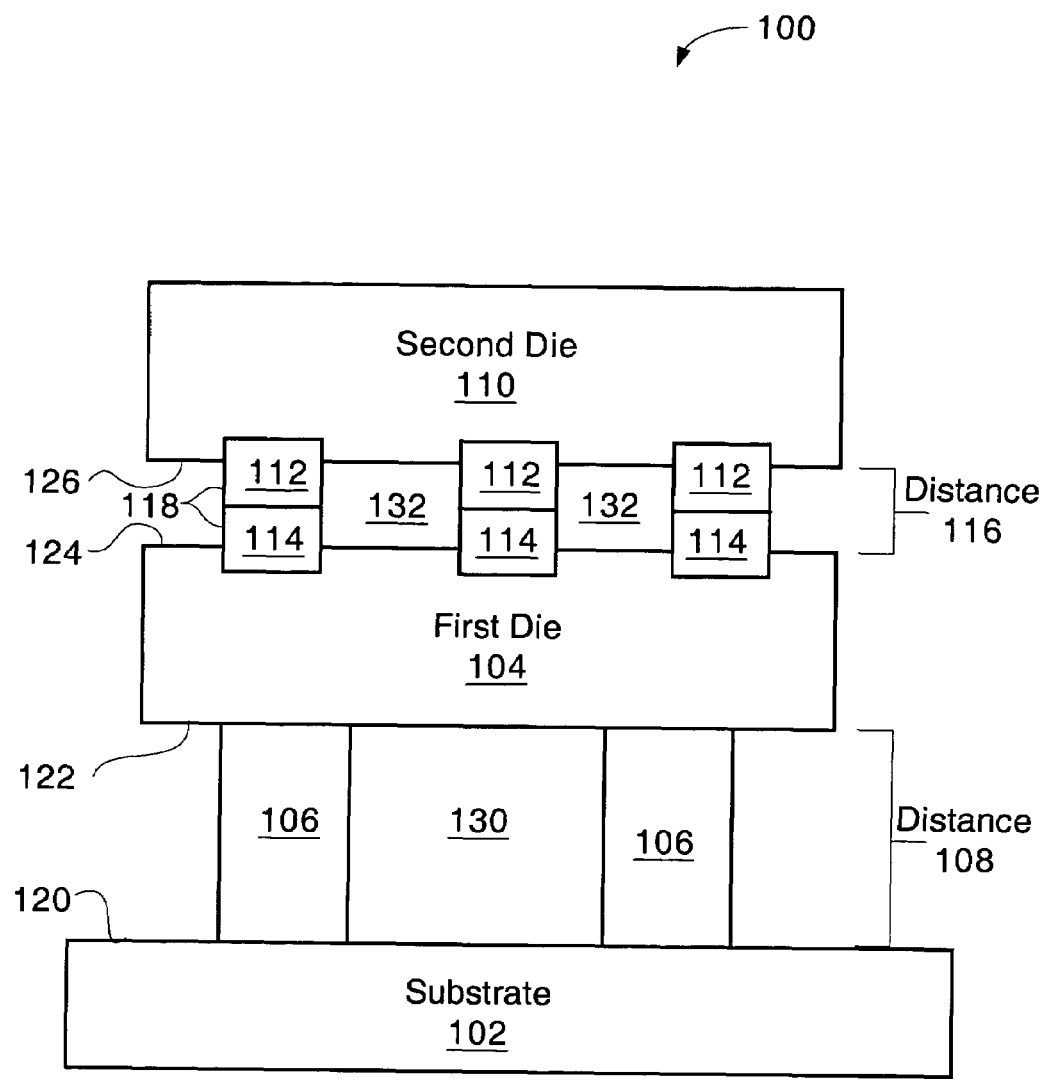
FIG. 1a is a cross sectional side view of a three dimensional metal bonded integrated circuit assembly.

FIG. 1a is a cross sectional side view of a three dimensional metal bonded integrated circuit assembly 100 according to one embodiment of the present invention. The circuit assembly may include a substrate 102 in one embodiment. The substrate 102 may be a physical structure or layer that is a basic workpiece transformed and/or added to by various processes into the desired microelectronic configuration. The substrate 102 may include conducting material, insulating material, semiconducting material, and other materials or material combinations. In some embodiments, the substrate 102 may be a layered structure. The substrate 102 may add structural strength and rigidity to the assembly and facilitate electrical connection of the assembly 102 with an external component, such as a printed circuit board (not shown).

The assembly 100 may include a first die 104. The first die 104 may be an integrated circuit die and include one or more microelectronic devices, such as transistors or other devices. The first die 104 may be connected to the substrate 102 by a first set of conductive connection structures 106. These connection structures 106 may be, for example, controlled collapse chip connects ("C4"), solder ball bumps, or other connection structures 106, and they may connect the first die 104 to the substrate 102 electrically and/or structurally in some embodiments. There may be a distance 108 between a first surface 120 of the substrate 102 and a first surface 122 of the first die 104. This distance 108 may be in a range from about 75 to about 100 microns in some embodiments. There may be a volume 130 between the first die 104 and the substrate 102 and around the connection structures 106.

The assembly 100 may also include a second die 110. The second die 110 may be an integrated circuit die and include one or more microelectronic devices, such as transistors or other devices. The second die 110 may have a first surface 126.

The first die 104 may have several conductive structures 114. The second die 110 may also have several conductive structures 112. These structures 112, 114 may be made of a metal, such as copper, or another conductive material. The structures 114 of the first die 104 may extend beneath the second surface 124 of the first die 104 into the first die 104, and also extend above the second surface 124 of the first die 104. The structures 112 of the second die 110 may extend beneath the first surface 126 of the second die 110 into the second die 110, and also extend beyond the first surface 126 of the second die 110.

The conductive structures 114, 112 may be first and second sets, respectively, of portions of conductive connection structures 118 that may extend between and connect the first die 104 and the second die 110. In an embodiment, the conductive structures 114, 112 may comprise copper and be bonded together to connect the first die 104 and the second die 110. The conductive structures 114 of the first die 104 make up the first portions of conductive connection structures 118 and the conductive structures 112 of the second die 110 make up the second portions of conductive connection structures 118 that are formed once the conductive structures 114, 112 are bonded together. Together, each bonded pair of conductive structures 114, 112 comprise a conductive connection structure 118 that connects the first die 104 to the second die 110.

There may be a distance 116 between a second surface 124 of the first die 104 and the first surface 126 of the second die 110. This distance 116 may be in a range from about 100 to about 200 nanometers in some embodiments. There may be a volume 132 between the first die 104 and the second die 110 and around the bonded connection structures 114, 112. As is apparent from FIG. 1a, at this point the bonded connection structures 114, 112 between the first and second dies 104, 110 of the three dimensional metal bonded integrated circuit assembly 100 are exposed to the environment surrounding the assembly 100.

Figure 1B:
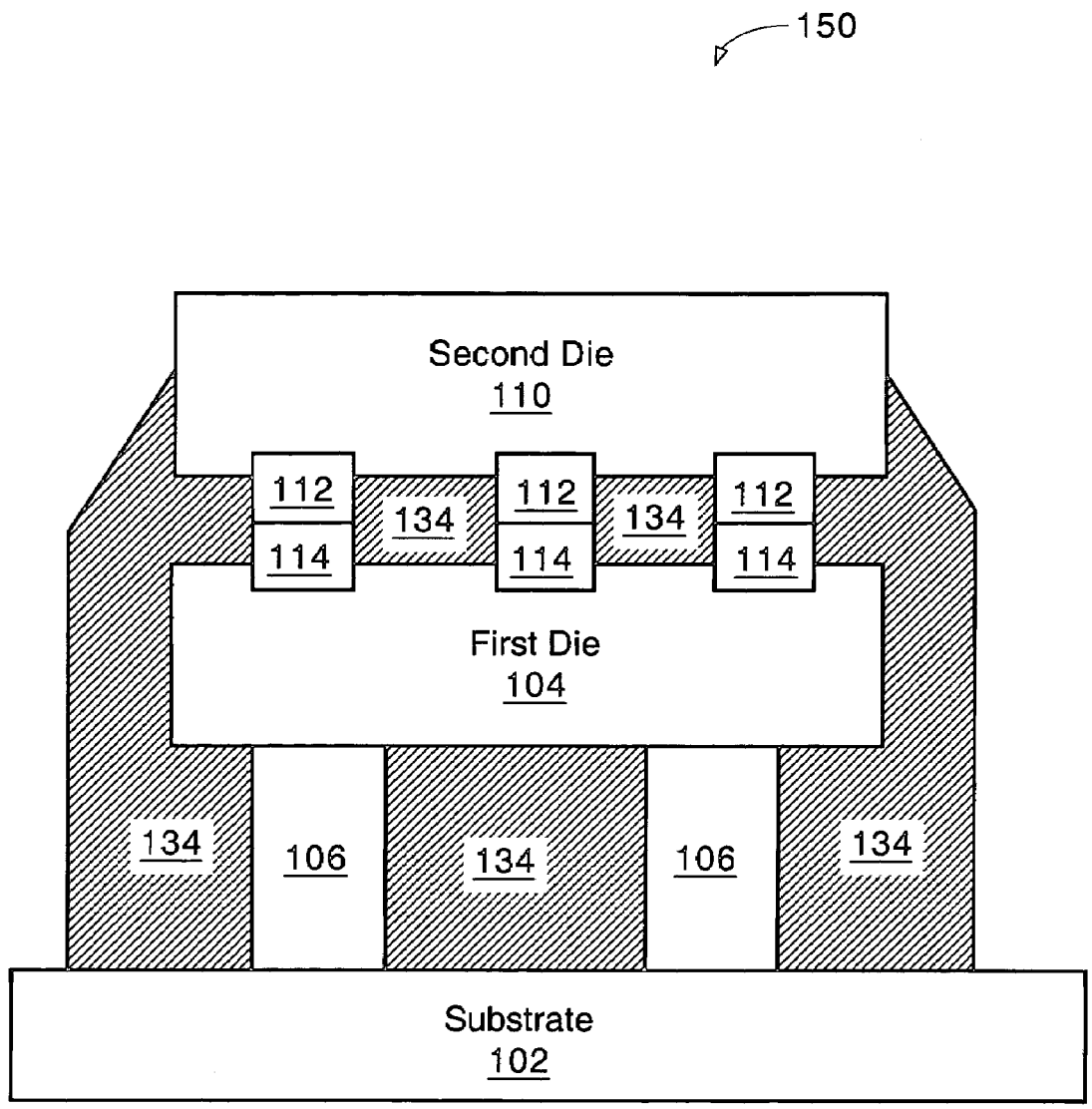
FIG. 1b is a cross sectional side view of a first embodiment of a sealed three dimensional metal bonded integrated circuit assembly.

FIG. 1b is a cross sectional side view of a first embodiment of a sealed three dimensional metal bonded integrated circuit assembly 150. The sealed assembly 150 of FIG. 1b is similar to the three dimensional metal bonded integrated circuit assembly 100 of FIG. 1a. However, in the sealed assembly 150 of FIG. 1b, the bonded connection structures 114, 112 between the first and second dies 104, 110 have been sealed from the surrounding environment. By sealing the volume 132 between the first and second dies 104, 110 from the surrounding environment, undesired effects, such as corrosion of copper connection structures 114, 112, may be avoided.

In some embodiments, underfill material 134 that is used to fill the volume 130 between the first die 104 and the substrate 102 is also used to seal the volume 132 between the first and second dies 104, 110. The underfill material 134 thus also acts as a sealing layer. Enough underfill material 134 may be applied to the unsealed and not yet underfilled assembly 100 so that the material 134 fills the volume 130 between the first die 104 and the substrate 102 and also seals the volume 132 between the first and second dies 104, 110. This underfill material 134 that acts as a sealing layer may be applied at the same time as the underfill material 134 that acts as underfill between the substrate 102 and the first die 104. The underfill material 134 may be an epoxy or other material, and may comprise filler particles, such as glass filler particles, which may have a size of about one micron. In the embodiment shown in FIG. 1b, the underfill material 134 may have no filler particles, or the particles may be small enough (smaller than the distance 116 between the first and second dies 104, 110) that the underfill material 134 fills the volume 132 between the first and second dies 104, 110. This material may substantially fill the volume 132 through capillary action after the underfill material 134 is applied at the perimeter of the assembly 150. For example, in an embodiment the underfill material 134 may comprise an epoxy material that is heated to a temperature between about 50 and 120 degrees Celsius, whereupon the viscosity of the material 134 decreases to allow it to more easily flow between the first and second dies 104, 110 by capillary action. In some embodiments, the temperature of the underfill material 134 may be increased even higher to cure the material and substantially prevent further flow. For example, in one embodiment, the material 134 may be heated to a temperature above about 150 degrees Celsius to cure the material 134.

Figure 1C:
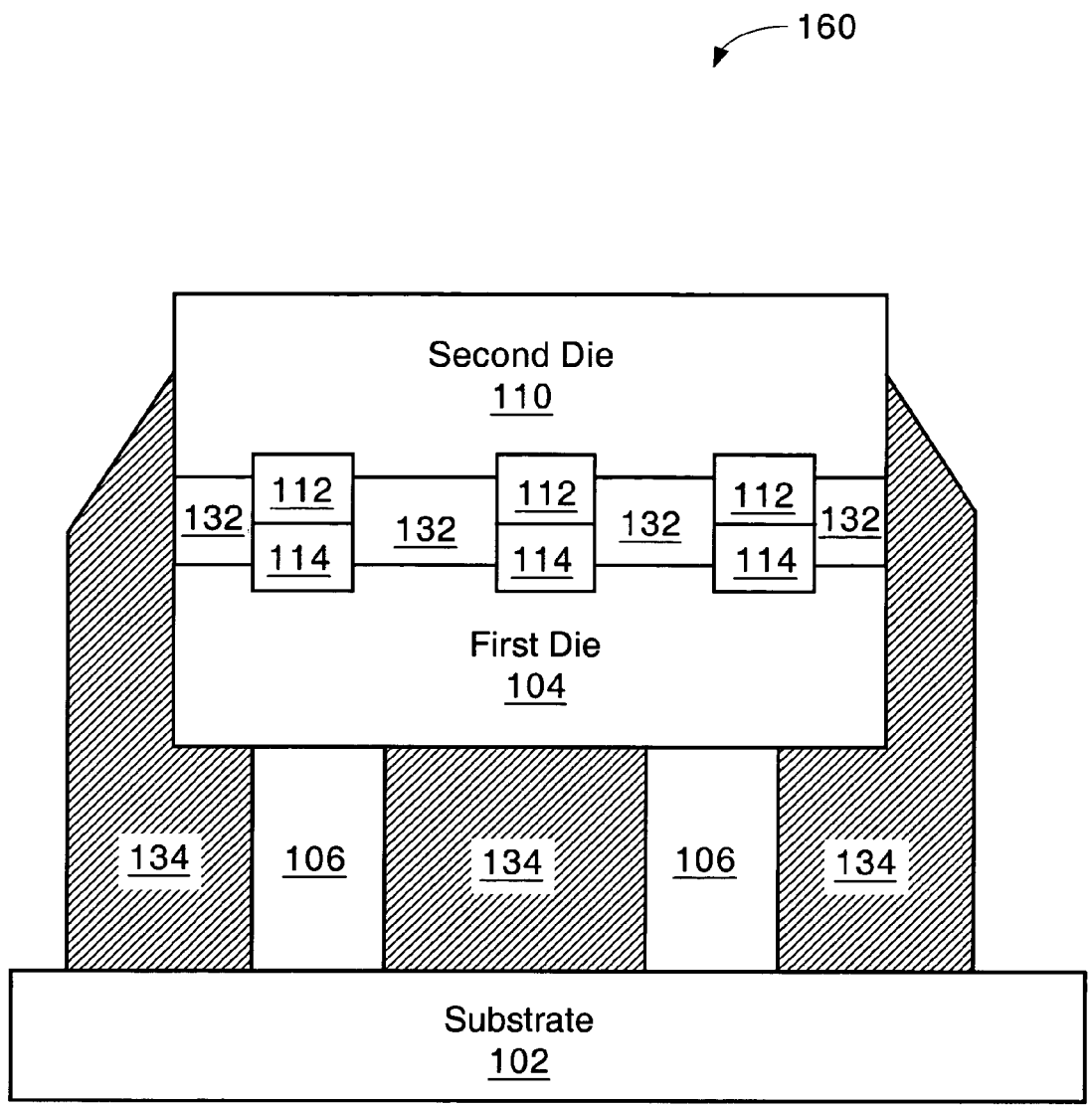
FIG. 1c is a cross sectional side view of a second embodiment of a sealed three dimensional metal bonded integrated circuit assembly.

FIG. 1c is a cross sectional side view of a second embodiment of a sealed three dimensional metal bonded integrated circuit assembly 160. The sealed assembly 160 of FIG. 1c is similar to the three dimensional metal bonded integrated circuit assembly 100 of FIG. 1a. However, in the sealed assembly 150 of FIG. 1c, the bonded connection structures 114, 112 between the first and second dies 104, 110 have been sealed from the environment. By sealing the volume 132 between the first and second dies 104, 110 from the surrounding environment, undesired effects, such as corrosion of copper connection structures 114, 112, may be avoided. Unlike the embodiment 150 shown in FIG. 1b, the volume 132 between the first and second dies 104, 110 is not substantially filled.

In some embodiments, underfill material 134 that is used to fill the volume 130 between the first die 104 and the substrate 102 is also used to seal the volume 132 between the first and second dies 104, 110. Enough underfill material 134 may be applied so that the material 134 extends from the second surface 124 of the first die 104 to the first surface 126 of the second die 110 around the perimeters of the first and second dies 104, 110 to seal off the volume 132 between the first and second dies 104, 110 from the surrounding environment. The underfill material 134 thus acts as a sealing layer.

The underfill material 134 may be an epoxy or other material, and may comprise filler particles. In the embodiment shown in FIG. 1c, the underfill material 134 may comprise filler particles that are large enough to substantially prevent the material 134 from extending into the volume 130 between the first and second dies 104, 110. For example, the filler particles may comprise silica particles with an average diameter of about 1 micron in one embodiment, which would prevent the material 134 from getting between an embodiment of the assembly 160 where the distance 116 between the first and second dies 104, 110 may be in a range from about 100 to about 200 nanometers. Alternatively, the material 134 may be of a type that would not fill the volume 132 between the first and second dies 104, 110 by capillary action.

Figure 1D:
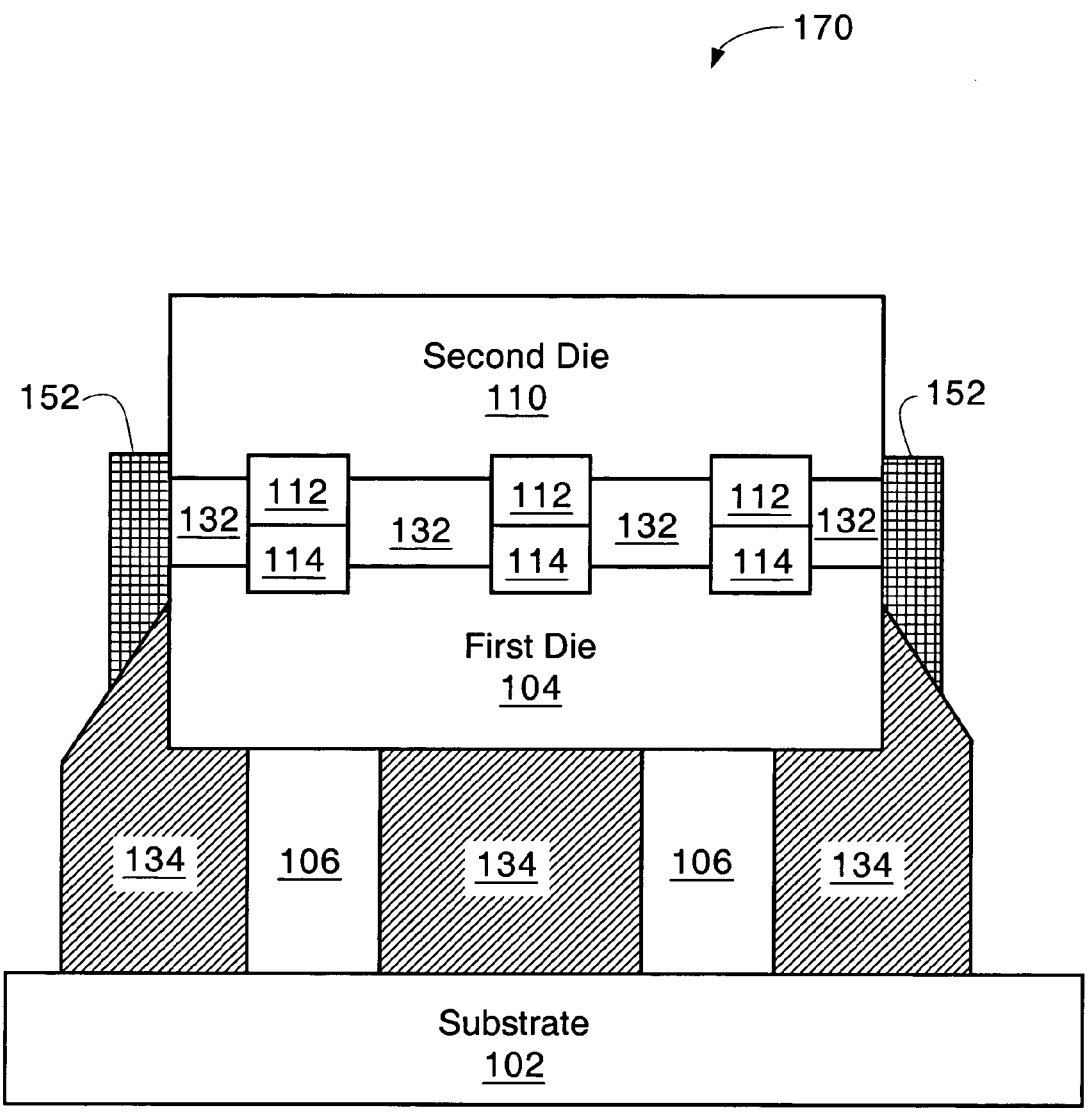
FIG. 1d is a cross sectional side view of a third embodiment of a sealed three dimensional metal bonded integrated circuit assembly.

FIG. 1d is a cross sectional side view of a third embodiment of a sealed three dimensional metal bonded integrated circuit assembly 170. In the embodiment shown in FIG. 1d, the sealing layer 152 may comprise a material that is not the same as the underfill material 134 or is applied in a separate step from the application of the underfill material 134 used to fill the volume 130 between the first die 104 and the substrate 102. The sealing layer 152 may be applied after underfill material 134 is applied. In an embodiment, underfill material 134 is applied to fill the volume 130 between the first die 104 and the substrate 102. Sealing material to form the sealing layer 152 may then be applied after the application of the underfill material 134 to seal the volume 132 between the first and second dies 104, 110. Such sealing material forming the sealing layer 152 may be similar or the same as the underfill material 134, and may be, for example a material that comprises epoxy. The sealing material may also comprise a different material than the underfill material 134.

The material may extend between the second surface 124 of the first die 104 and the first surface 126 of the second die 110 to seal the volume 132 without filling the volume 132, as shown in FIG. 1d. In another embodiment (not shown), the sealing layer 152 may also extend into the volume 132 between the first and second dies 104, 110 to fully or partially fill the volume 132 between the first and second dies 104, 110. The sealing scheme shown in FIG. 1d may be used in embodiments where the distance 108 between the substrate 102 and the first die 104 is on the smaller side, such as close to 75 microns.

Figure 1E:
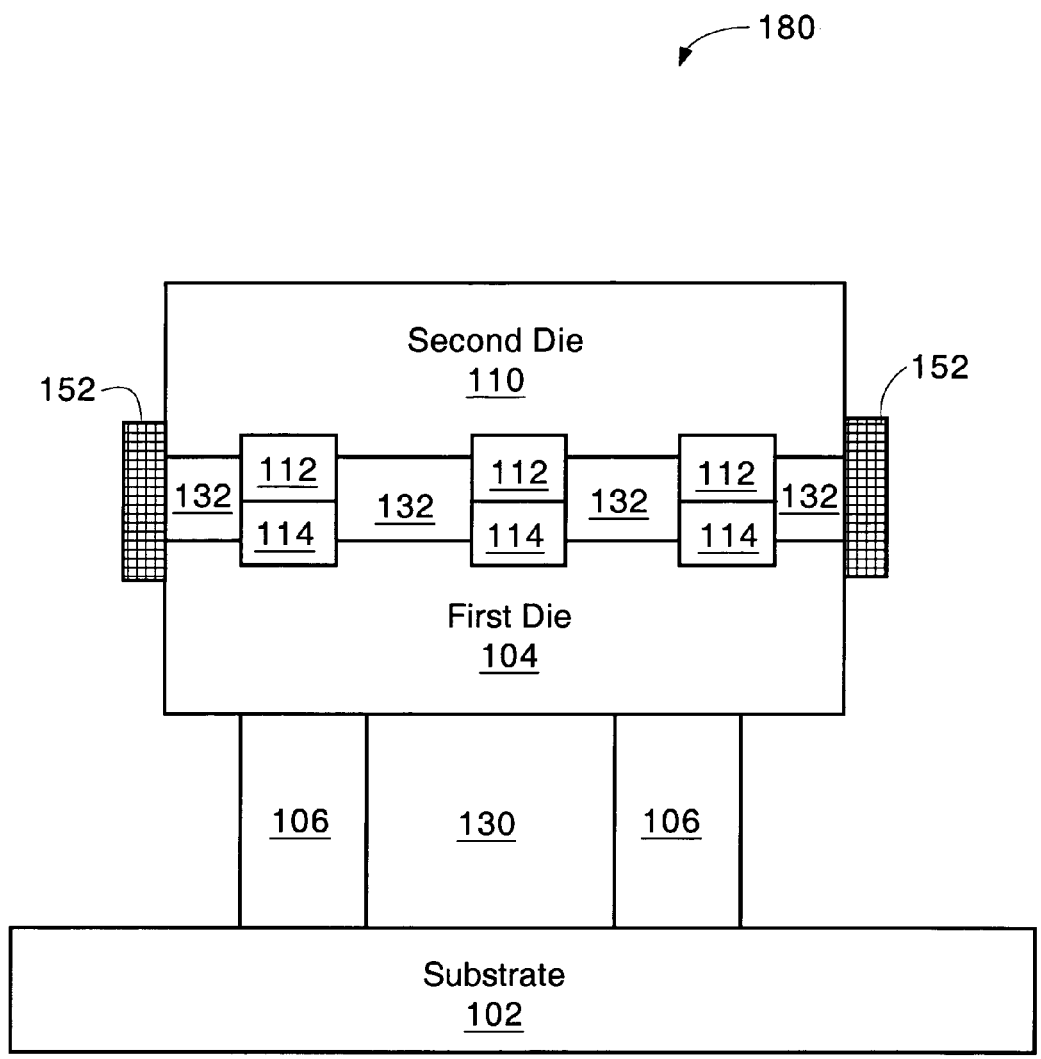
FIG. 1e is a cross sectional side view of a fourth embodiment of a sealed three dimensional metal bonded integrated circuit assembly.

FIG. 1e is a cross sectional side view of a fourth embodiment of a sealed three dimensional metal bonded integrated circuit assembly 180. In the embodiment shown in FIG. 1e, the sealing layer 152 may be applied before underfill material 134 is applied, or it is possible to have an assembly 180 where no underfill material 134 is applied. The sealing layer is applied to seal off the volume 132 between the first and second dies 104, 110. The sealing layer may fully or partially fill the volume 132 to seal the conductive connection structures 118 between the first and second dies 104, 110, or may merely extend between the second surface 124 of the first die 104 and the first surface 126 of the second die 110 around the perimeter to seal the volume between the first and second dies 104, 110, including the conductive connection structures 118, from the surrounding environment. Other embodiments are also possible.

FIGS. 1b through 1e illustrate sealing two stacked dies. In other embodiments, there may be more than two stacked dies. For example, there may be a third die stacked on the two dies 104, 110 illustrated in FIG. 1b. There may be a volume between the second die 110 and the third die. This volume may be sealed similarly to any of the ways discussed above with regards to FIGS. 1b through 1e. There may be more than three stacked dies as well, in other embodiments. Volumes between stacked dies may be sealed in any suitable manner as discussed herein. Thus, the sealing of volumes between stacked dies in FIGS. 1b, through 1e, as well as other relevant discussion related to FIGS. 2 through 4 may be equally applicable to three or more stacked dies, in addition to the two stacked dies explicitly discussed.

Figure 2:
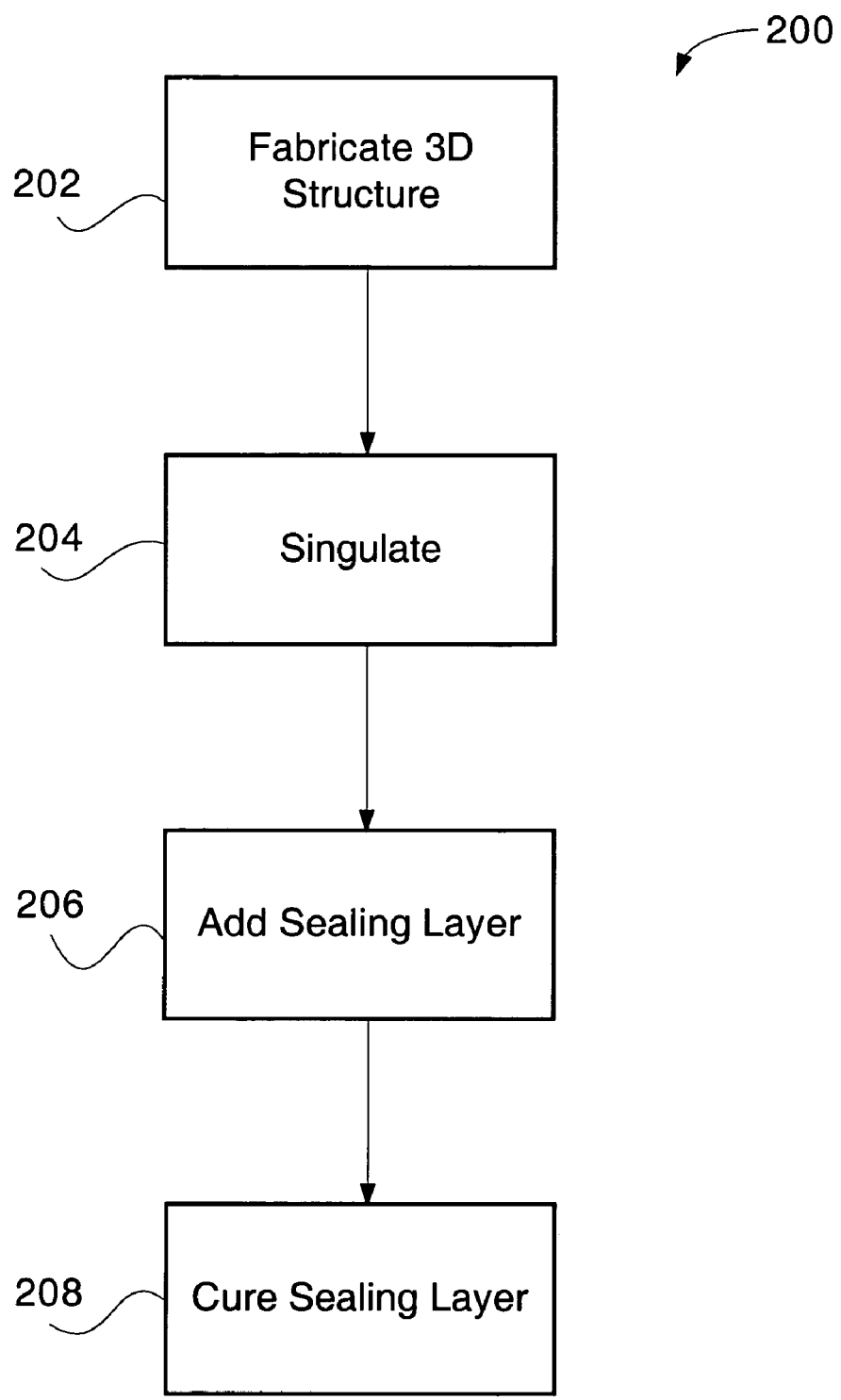
FIG. 2 is a flow chart that illustrates a method for fabricating a sealed three dimensional metal bonded integrated circuit assembly according to one embodiment of the present invention.

FIG. 2 is a flow chart 200 that illustrates a method for fabricating a sealed three dimensional metal bonded integrated circuit assembly, such as the assembly 150 of FIG. 1b, according to one embodiment of the present invention. In other embodiments, some of the steps shown in the flow chart 200 may be omitted, other steps may be added, and/or the steps shown may be performed in a different order. The three dimensional metal bonded integrated circuit assembly 100 is fabricated 202. In an embodiment, this is done by fabricating multiple first dies 104 with their conductive structures 114 on a first wafer, fabricating multiple second dies 110 with their conductive structures 112 on a second wafer, then bonding the wafers together by bonding the conductive structures 114, 112 together. The bonded dies 104, 110 may then be singulated 204 to separate them from their respective wafers. The bonded dies 104, 110 may then be attached to a substrate 102. The sealing layer may then be added 206 to seal the conductive structures 112, 114 between the first and second dies 104, 110 from the surrounding environment. The sealing layer may be added 206 before or after the dies 104, 110 are attached to the substrate 102. If appropriate, the sealing layer may then be cured 208.

Figure 3A:
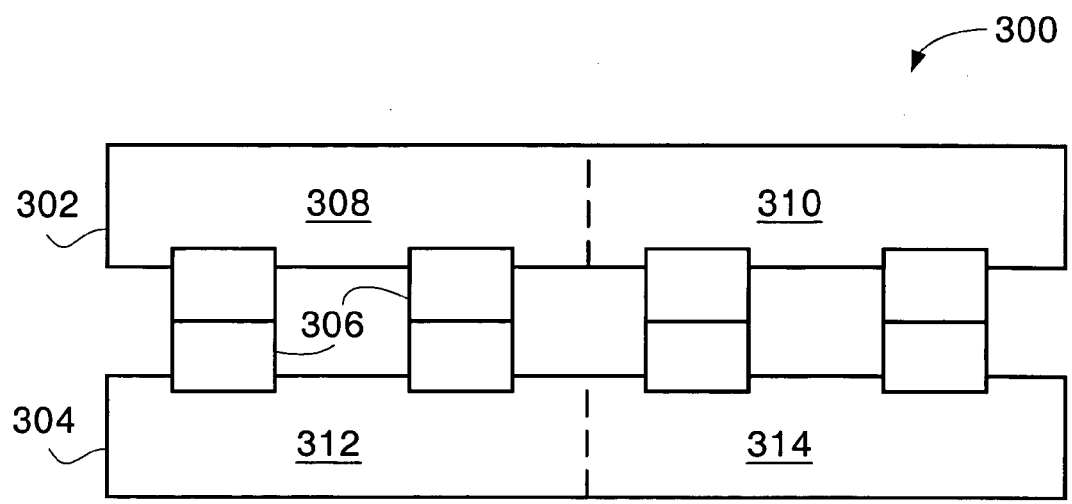
FIGS. 3a through 3d are cross sectional side views illustrating another embodiment in which the conductive connection structures between a first die and a second die in a three dimensional metal bonded integrated circuit assembly are sealed from a surrounding environment.

FIGS. 3a through 3d are cross sectional side views illustrating another embodiment in which the conductive connection structures 306 between a first die and a second die in a three dimensional metal bonded integrated circuit assembly are sealed from a surrounding environment prior to the dies being singulated from their respective wafers. FIG. 3a is a cross sectional side view of a three dimensional metal bonded wafer assembly 300 according to one embodiment. A first wafer 302 may have multiple dies 308, 310 fabricated on it. The dies 308, 310 may be integrated circuit dies and each may include one or more microelectronic devices, such as transistors or other devices. The dies 308, 310 may also include portions of conductive connection structures 306.

A second wafer 304 may have multiple dies 312, 314 fabricated on it. The dies 312, 314 may be integrated circuit dies and each may include one or more microelectronic devices, such as transistors or other devices. The dies 312, 314 may also include portions of conductive connection structures 306. The portions of the conductive connection structures 306 of the dies 308, 310 of the first wafer 302 may be bonded to the portions of the conductive connection structures 306 of the dies 312, 314 of the second wafer 304 to form the three dimensional metal bonded wafer assembly 300.

Figure 3B:
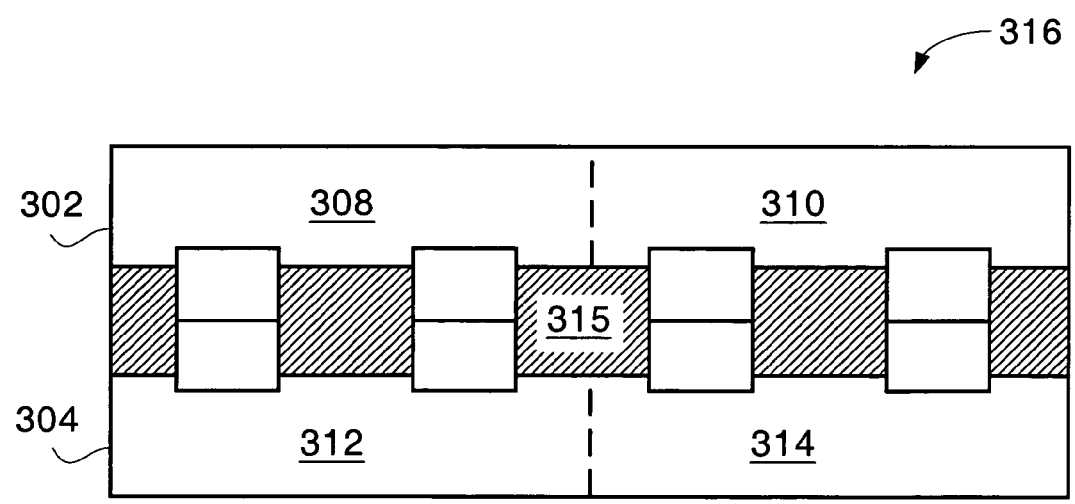

FIG. 3b is a cross sectional side view of a three dimensional metal bonded wafer assembly 316 after material 315 has been added to seal the conductive connection structures 306 from the surrounding environment according to one embodiment. In an embodiment, the material 315 may comprise an epoxy or other material. The material 315 may be applied to one or more locations around the perimeter of the sealed wafers 302, 304. The material 315 may then travel from the edge of the bonded wafers 302, 304 to substantially fill the volume between the bonded wafers 302, 304 through capillary action.

Figure 3C:
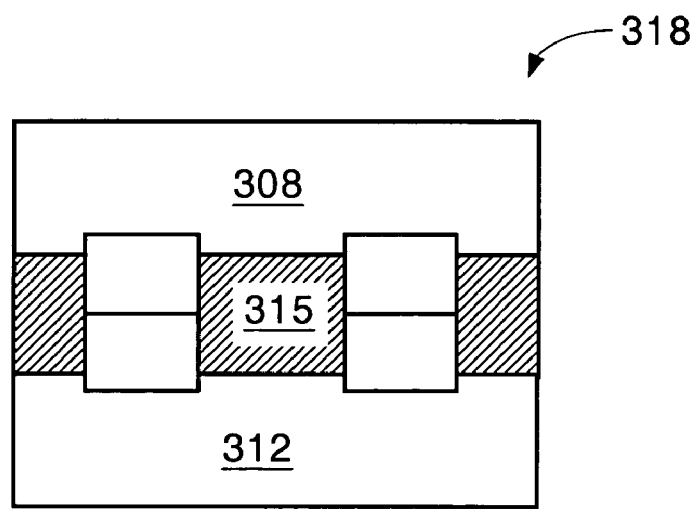

FIG. 3c is a cross sectional side view of a three dimensional metal bonded integrated circuit assembly 318 after it has been separated from the bonded wafer assembly 316 of FIG. 3b. After the material 315 has been added to substantially fill the volume between the bonded wafers 302, 304 as shown in FIG. 3b, bonded integrated circuit assemblies 318 may be cut from the bonded wafer assembly 316. For example, a first bonded integrated circuit assembly 318 may comprise a die 308 from the first wafer 302 bonded to a die 312 from the second wafer 304. The conductive connection structures 306 that bond the dies 308, 312 together may be sealed from the surrounding environment by material 315 between the dies 308, 312 that acts as a sealing layer.

Figure 3D:
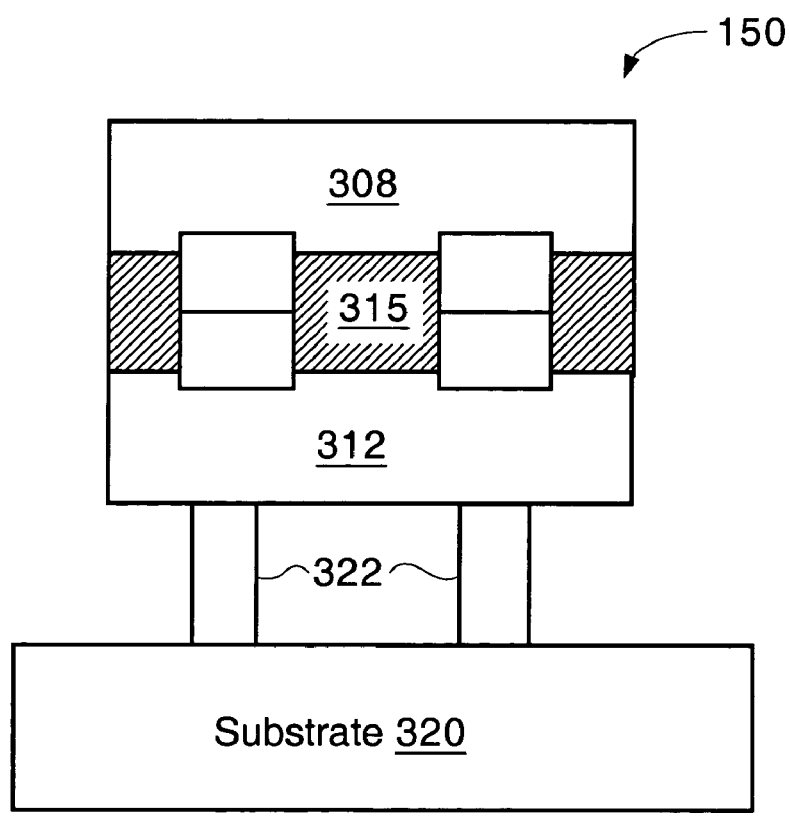

FIG. 3d is a cross sectional side view of a fourth embodiment of a sealed three dimensional metal bonded integrated circuit assembly 150. The bonded dies 308, 312 of FIG. 3c may be attached to a substrate 320 by connection structures 322, which may be, for example, controlled collapse chip connects ("C4"), solder ball bumps, or other connection structures 322. The resulting assembly 150 may comprise sealed and bonded integrated circuit dies 308, 312 connected to a substrate similar to the assembly 150 of FIGS. 1b through 1e. Underfill material may then be applied to fill the volume between the bottom die 312 and the substrate 320 in some embodiments.

Figure 4:
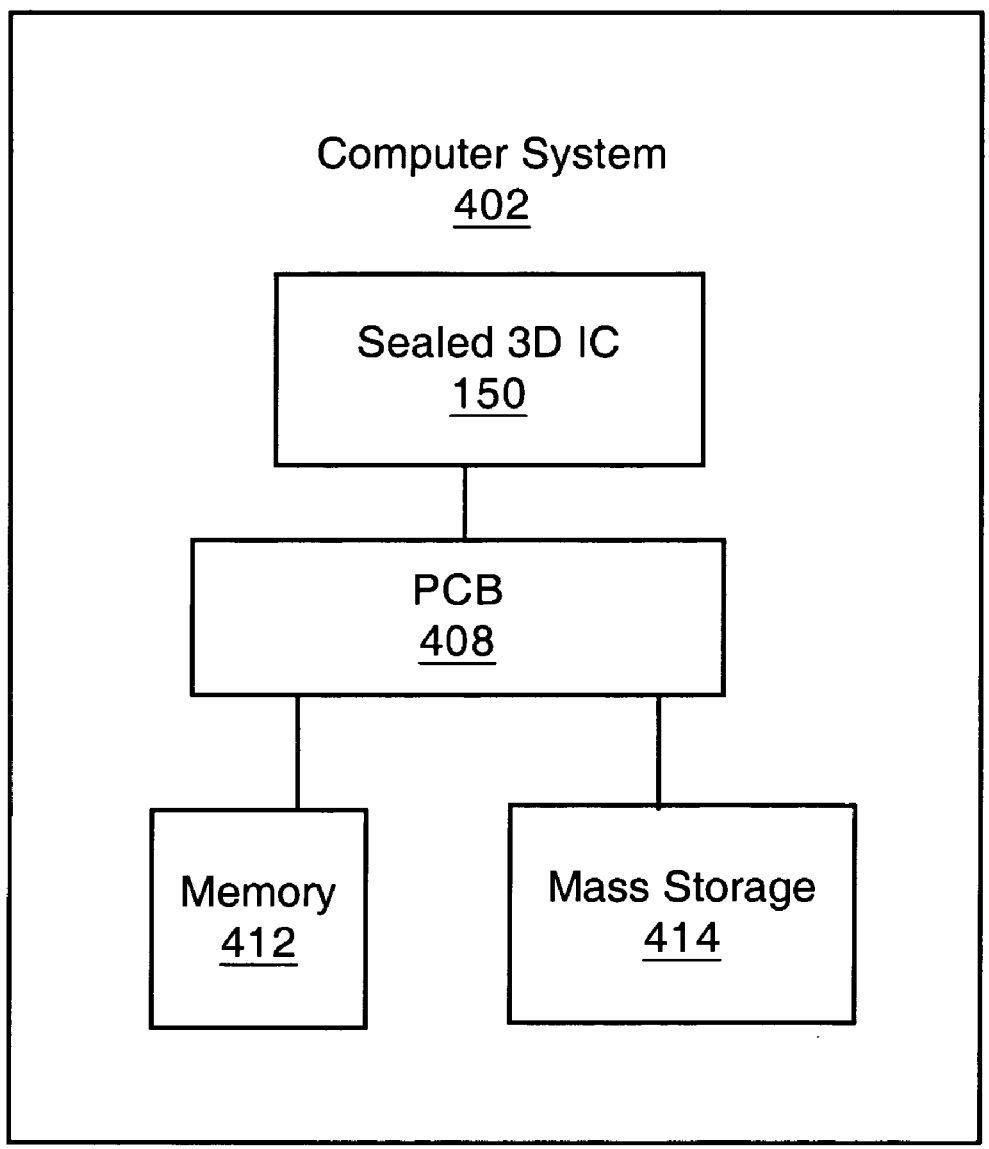
FIG. 4 is a schematic diagram of a computer system according to one embodiment of the present invention.

FIG. 4 is a schematic diagram of a computer system 402 according to one embodiment of the present invention. The computer system 402 may include the sealed three dimensional metal bonded integrated circuit assembly 150, as described above. The sealed three dimensional metal bonded integrated circuit assembly 150 may be connected to a structure such as a printed circuit board ("PCB") 408 by connectors such as solder balls or other connectors. Additionally, the computer system 402 may include a memory 412 and/or a mass storage unit 414, and/or other components which may be connected to the PCB 408. The memory 404 may be any memory, such as random access memory, read only memory, or other memories. The mass storage unit 414 may be a hard disk drive or other mass storage device. The computer system 402 may also include other components such as input/output units, a microprocessor, or other components.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:
1. A method, comprising:
   sealing a device, the device comprising:
   a substrate with a top surface;
   a first integrated circuit die above the substrate and spaced apart from the substrate by a first distance to form a first volume between the substrate and the first integrated circuit die, the first integrated circuit die having a bottom surface closer to the substrate and a top surface further from the substrate and a plurality of microelectronic devices;
   a first plurality of connectors extending from the top surface of the substrate to the bottom surface of the first integrated circuit die and forming an electrical connection between the substrate and the bottom surface of the first integrated circuit;
   a second integrated circuit die above the first integrated circuit die and spaced apart from the first integrated circuit die by a second distance to form a second volume between the first integrated circuit die and the second integrated circuit die, the second integrated circuit die having a bottom surface closer to the first integrated circuit die and a top surface further from the first integrated circuit die and a plurality of microelectronic devices;
   a second plurality of connectors extending from the top surface of the first integrated circuit die to the bottom surface of the second integrated circuit die;
   wherein sealing the device comprises substantially sealing the second volume between the first and second integrated circuit dies from a surrounding environment by applying a layer of underfill material extending from the substrate to the second integrated circuit die, the second volume between the first integrated circuit die and the second integrated circuit die and the second volume around the second plurality of connectors being substantially free of the underfill material after sealing the device.

2. The method of claim 1, wherein formation of the device comprises:
   fabricating the first integrated circuit die, the fabricated first integrated circuit die having a first set of first portions of the second plurality of connectors;
   fabricating the second integrated circuit die, the fabricated second integrated circuit die having a second set of second portions of the second plurality of connectors;
   singulating the first integrated circuit die from a first wafer comprising a plurality of integrated circuit dies;
   singulating the second integrated circuit die from a second wafer comprising a plurality of integrated circuit dies; and
   bonding the first set of first portions to the second set of second portions to connect the first integrated circuit die to the second integrated circuit die.

3. The method of claim 2, wherein the device is sealed after the first and second integrated circuit dies have been singulated from the first and second wafers.

4. The device of claim 3, wherein the device is sealed by a layer of underfill material and the layer of underfill material comprises filler particles having an average diameter greater than the second distance between the first integrated circuit die and the second integrated circuit die.

5. The device of claim 3, wherein the first distance between the substrate and the first integrated circuit die is in a range from about 75 microns to about 100 microns, and the second distance between the first integrated circuit die and the second integrated circuit die is in a range from about 100 nanometers to about 200 nanometers.

6. The method of claim 3, wherein sealing the device comprises applying a layer of material extending from the first integrated circuit die to the second integrated circuit die.

7. The method of claim 1, wherein the first plurality of connectors do not extend substantially beyond the top surface of the substrate or the bottom surface of the first integrated circuit.

8. The method of claim 1, wherein the second plurality of connectors do not extend substantially beyond the top surface of the first integrated circuit or the bottom surface of the second integrated circuit.

9. The method of claim 1, wherein sealing the device comprises applying a single layer of underfill material extending from the substrate to the second integrated circuit die, the layer of underfill material being in contact with both the first and second integrated circuit dies.

10. A method, comprising:
    sealing a device, the device comprising:
    a substrate;
    a first integrated circuit die above the substrate and spaced apart from the substrate by a first distance to form a first volume between the substrate and the first integrated circuit die, the first integrated circuit die having a plurality of microelectronic devices;
    a first plurality of connectors extending from the substrate to the first integrated circuit die;
    a second integrated circuit die above the first integrated circuit die and spaced apart from the first integrated circuit die by a second distance to form a second volume between the first integrated circuit die and the second integrated circuit die, the second integrated circuit die having a bottom surface closer to the first integrated circuit die and a top surface further from the first integrated circuit die a plurality of microelectronic devices;
    a second plurality of connectors extending from top surface of the first integrated circuit die to the bottom surface of the second integrated circuit die;
    wherein sealing the device comprises substantially sealing the second volume between the first and second integrated circuit dies from a surrounding environment by applying a layer of underfill material extending from the substrate to the second integrated circuit die, the second volume between the first integrated circuit die and the second integrated circuit die and around the second volume the second plurality of connectors remaining substantially free of the underfill material after sealing.

11. The method of claim 9, wherein the device is sealed after the first and second integrated circuit dies have been singulated from first and second wafers.

12. The method of claim 9, wherein sealing the device comprises applying a single layer of underfill material extending from the substrate to the second integrated circuit die, the layer of underfill material being in contact with both the first and second integrated circuit dies.

* * * * *